United States Patent
Dawson et al.

(10) Patent No.: US 9,790,089 B2
(45) Date of Patent: Oct. 17, 2017

(54) MEMS SENSOR WITH SIDE PORT AND METHOD OF FABRICATING SAME

(71) Applicant: NXP USA, INC., Austin, TX (US)

(72) Inventors: Chad S. Dawson, Tempe, AZ (US);
Stephen R. Hooper, Tempe, AZ (US);
Fengyuan Li, Chandler, AZ (US);
Arvind S. Salian, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/448,801

(22) Filed: Mar. 3, 2017

(65) Prior Publication Data

US 2017/0174509 A1    Jun. 22, 2017

Related U.S. Application Data

(62) Division of application No. 14/861,550, filed on Sep. 22, 2015, now abandoned.

(51) Int. Cl.
*B81C 1/00* (2006.01)
*B81B 7/00* (2006.01)

(52) U.S. Cl.
CPC ........ *B81C 1/00309* (2013.01); *B81B 7/0061* (2013.01); *B81C 1/00865* (2013.01);
(Continued)

(58) Field of Classification Search
CPC . B81B 7/0061; B81C 1/00309; B81C 1/0071; B81C 1/00214; B81C 1/00865–1/00904
See application file for complete search history.

(56) References Cited

U.S. PATENT DOCUMENTS

| 7,644,625 B2 | 1/2010 | Ricks |
| 7,902,843 B2 | 3/2011 | Fang et al. |

(Continued)

FOREIGN PATENT DOCUMENTS

WO    WO-2014/193307 A1    12/2014

OTHER PUBLICATIONS

Office Action from U.S. Appl. No. 14/861,550; 17 pages (dated Jul. 21, 2016).

(Continued)

*Primary Examiner* — Stephen Bradley
(74) *Attorney, Agent, or Firm* — Charlene R. Jacobsen

(57) ABSTRACT

A MEMS sensor package comprises a MEMS die that includes a substrate having a sensor formed thereon and a cap layer coupled to the substrate. The cap layer has a cavity overlying a substrate region at which the sensor resides. A port extends between the cavity and a side wall of the MEMS die and enables admittance of fluid into the cavity. Fabrication methodology entails providing a substrate structure having sensors formed thereon, providing a cap layer structure having inwardly extending cavities, and forming a channel between pairs of the cavities. The cap layer structure is coupled with the substrate structure and each channel is interposed between a pair of cavities. A singulation process produces a pair of sensor packages, each having a port formed by splitting the channel, where the port is exposed during singulation and extends between its respective cavity and side wall of the sensor package.

20 Claims, 5 Drawing Sheets

(52) U.S. Cl.
CPC ........... *B81B 2201/0264* (2013.01); *B81B 2203/0118* (2013.01); *B81B 2203/0127* (2013.01); *B81B 2203/0315* (2013.01); *B81B 2203/0392* (2013.01); *B81B 2207/012* (2013.01); *B81B 2207/097* (2013.01); *B81C 2203/0109* (2013.01); *H01L 2224/48145* (2013.01); *H01L 2924/181* (2013.01)

(56) References Cited

U.S. PATENT DOCUMENTS

| | | | |
|---|---|---|---|
| 8,297,125 | B2 | 10/2012 | Stewart et al. |
| 9,676,618 | B2 * | 6/2017 | Ding ............... B81C 1/00888 |
| 2006/0278978 | A1 | 12/2006 | Woerner |
| 2008/0217709 | A1 * | 9/2008 | Minervini ............ B81B 7/0061 |
| | | | 257/416 |
| 2012/0175747 | A1 | 7/2012 | Schlarmann et al. |
| 2013/0127879 | A1 | 5/2013 | Burns et al. |
| 2013/0214365 | A1 | 8/2013 | Schlarmann et al. |
| 2014/0033814 | A1 | 2/2014 | Wen et al. |
| 2015/0076630 | A1 | 3/2015 | Low et al. |
| 2016/0061677 | A1 | 3/2016 | Han et al. |

OTHER PUBLICATIONS

Office Action from U.S. Appl. No. 14/861,550; 19 pages (dated Jan. 12, 2017).

Office Action from U.S. Appl. No. 14/861,550; 5 pages (dated May 18, 2016).

\* cited by examiner

MEMS SENSOR WITH SIDE PORT AND METHOD OF FABRICATING SAME

CROSS REFERENCE TO RELATED APPLICATION(S)

The present application is a Divisional of pending U.S. patent application Ser. No. 14/861,550, entitled "MEMS SENSOR WITH SIDE PORT AND METHOD OF FABRICATING SAME," filed on 22 Sep. 2015, the entirety of which are herein incorporated by reference.

TECHNICAL FIELD OF THE INVENTION

The present invention relates generally to microelectromechanical systems (MEMS) sensor packages. More specifically, the present invention relates to a MEMS sensor with a side wall port to provide a path for passage of an external fluid medium.

BACKGROUND OF THE INVENTION

Microelectromechanical systems (MEMS) devices are semiconductor devices with embedded mechanical components. MEMS devices include, for example, pressure sensors, accelerometers, gyroscopes, microphones, digital mirror displays, micro fluidic devices, and so forth. MEMS devices are used in a variety of products such as automobile airbag systems, control applications in automobiles, navigation, display systems, inkjet cartridges, and so forth.

There are significant challenges to be surmounted in the packaging of MEMS devices due at least in part to the necessity for the MEMS devices to interact with the outside environment, the fragility of many types of MEMS devices, and severe cost constraints. Indeed, many MEMS device applications require smaller size and low cost packaging to meet aggressive cost targets.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

As the uses for microelectromechanical systems (MEMS) devices continue to grow and diversify, increasing emphasis is being placed on smaller size and low cost packaging without sacrificing part performance. Embodiments entail a MEMS sensor package and a method of fabricating the MEMS sensor package. In particular, the MEMS sensor package is formed, through the execution of relatively simple methodology, to include a MEMS sensor on a substrate that is covered by a cap layer. The MEMS sensor resides in a cavity formed in the cap layer, and a port extends between the cavity and a side wall of one of the substrate and the cap layer. The pressure port formed in the side wall is exposed during a strip singulation operation of the methodology so that fluid, such as air, external to the cavity can be admitted into the cavity.

The instant disclosure is provided to explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

Figure 1:
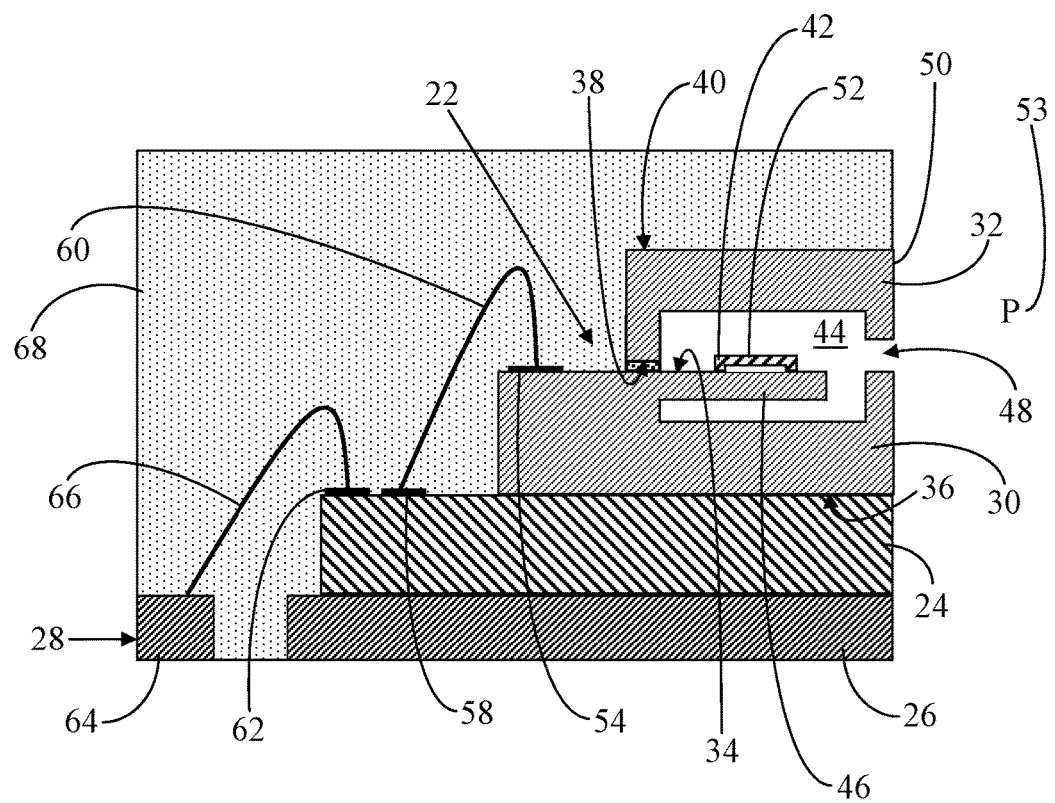
FIG. 1 shows a side sectional view of a microelectromechanical systems (MEMS) sensor package in accordance with an embodiment.

Referring to FIG. 1, FIG. 1 shows a side sectional view of a microelectromechanical systems (MEMS) sensor package 20 in accordance with an embodiment. FIG. 1 and subsequent FIGS. 2-8 are illustrated using various shading and/or hatching to distinguish the different elements of the MEMS sensor packages, as will be discussed below. These different elements within the structural layers may be produced utilizing current and upcoming micromachining techniques of depositing, patterning, etching, and so forth. It should be further understood that the use herein of relational terms, if any, such as first and second, top and bottom, and the like are used solely to distinguish one from another entity or action without necessarily requiring or implying any actual such relationship or order between such entities or actions.

MEMS sensor package 20 generally includes MEMS die 22 coupled to an application specific integrated circuit (ASIC), generally referred to herein as a semiconductor die 24. Semiconductor die 24, in turn, may be coupled to a mounting pad 26 of a carrier, referred to herein as a lead frame 28. MEMS die 22 includes a substrate 30 and a cap layer 32. In an embodiment, substrate 30 has a first inner surface 34 and a first outer surface 36. Similarly, cap layer 32 has a second inner surface 38 and a second outer surface 40. Second inner surface 38 of cap layer 32 is coupled to first inner surface 34 of substrate 30. A MEMS sensor 42 is formed on first inner surface 34 of substrate 30. More particularly, cap layer 32 includes a cavity 44 extending inwardly from second inner surface 38 and overlying a region 46 of first inner surface 34 of substrate 30. MEMS sensor 42 resides in cavity 44 at region 46 of first inner surface 34 of substrate 30.

One or both of substrate 30 and cap layer 32 includes a port 48 extending between cavity 44 and a side wall 50 of MEMS die 22, where side wall 50 extends between first outer surface 36 of substrate 30 and second outer surface 40 of cap layer 32. In the illustrated embodiment, port 48 is formed as a recess in second inner surface 38 of cap layer 32. In other embodiments, port 48 may be formed as a recess in first inner surface 34 of substrate 30. MEMS sensor 42 may be a pressure sensor having a pressure deformable diaphragm 52 disposed at region 46 of first inner surface 34 of substrate 30. Port 48 is configured to admit a fluid, e.g., air, from an environment external to cavity 44 into cavity 44. Since fluid can enter cavity 44 via port 48, MEMS pressure sensor 42 having pressure deformable diaphragm 52 can detect an ambient pressure 53, labeled P, of an environment external to MEMS sensor package 20.

MEMS die 22 further includes bond pads 54 on first inner surface 34 of substrate 30, but external to cap layer 32, and conductive traces 56 (shown in FIG. 5) interconnected between MEMS sensor 42 and bond pads 54. Conductive traces 56 suitably electrically couple MEMS sensor 42 with bond pads 54. Bond pads 54 may be utilized to electrically connect MEMS sensor 42 to bond pads 58 of semiconductor die 24 via electrically conductive interconnects, or bond wires 60 in this example. Semiconductor die 24 may include additional bond pads 62 that may be utilized to electrically connect semiconductor die 24 to external connection leads 64 of lead frame 28 via electrically conductive interconnects, or bond wires 66 in this example. Leads 64 provide input to and output from MEMS sensor package 20, as known to those skilled in the art.

An encapsulant 68 covers, or encapsulates, MEMS die 22, semiconductor die 24, bond wires 60, bond wires 66, and the top surfaces of leads 64. Encapsulant 68 (e.g., a mold compound or protective resin system) protects the components of MEMS sensor package 20 from exposure to external elements (e.g., air, moisture, and/or liquids) to provide robust mechanical and environmental protection. It should be noted, however, that encapsulant 68 does not obstruct port 48 in side wall 50 of MEMS sensor package 20. Fabrication methodology presented in detail herein enables the assembly of the components of MEMS sensor package 20 and, in some embodiments, their encapsulation with encapsulant 68 without obstructing port 48 in side wall 50.

Figure 2:
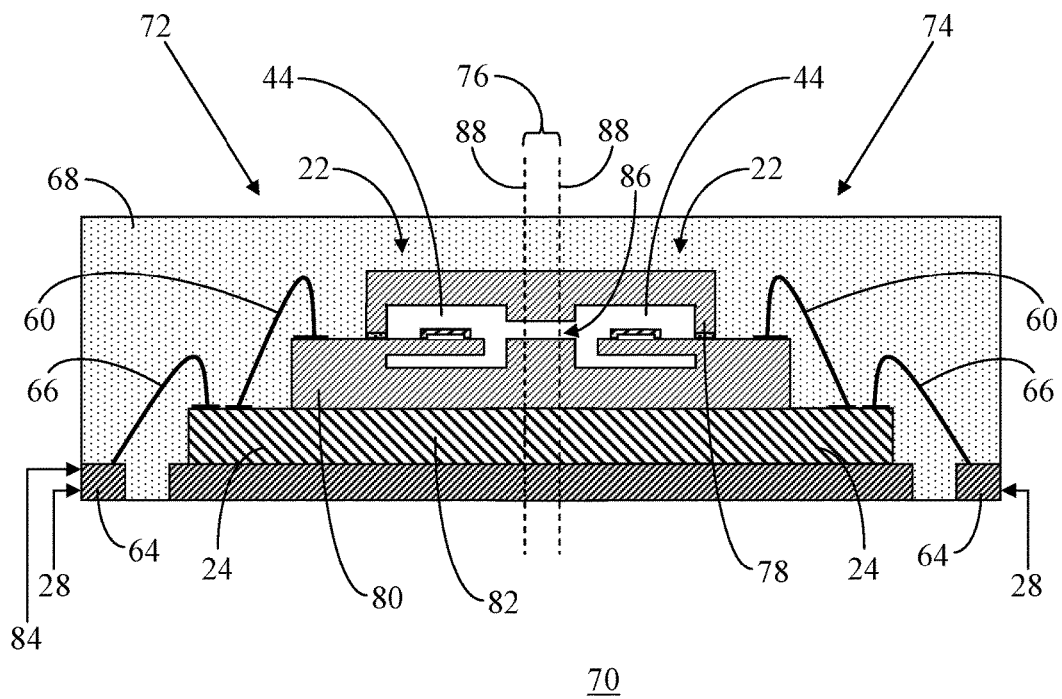
FIG. 2 shows a side sectional view of a structure that includes a first intermediate sensor structure and a second intermediate sensor structure prior to singulation.
Figure 3:
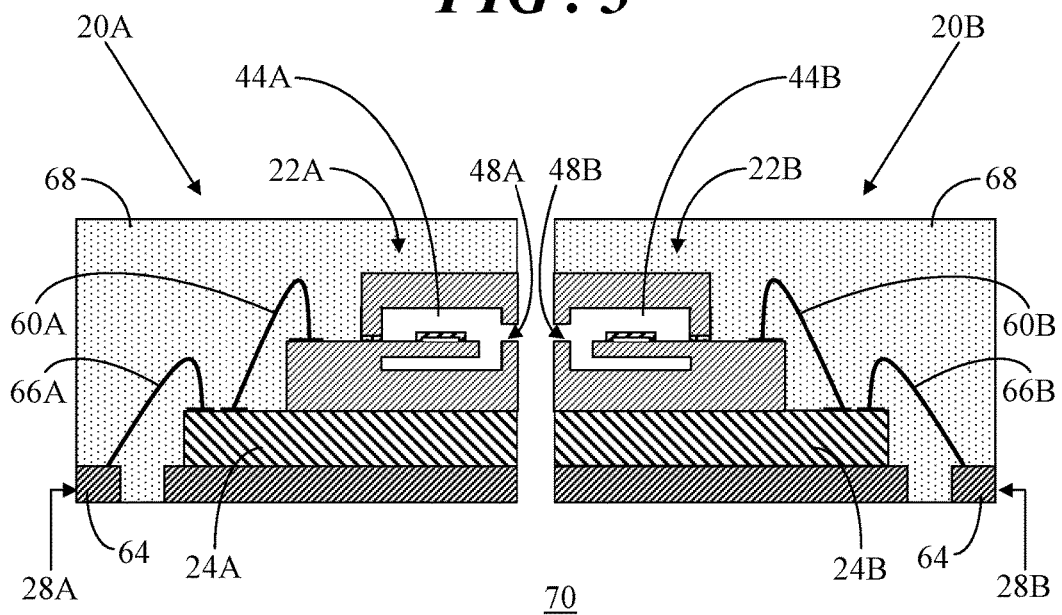
FIG. 3 shows a side sectional view of the structure of FIG. 2 following singulation.

Referring now to FIGS. 2 and 3, FIG. 2 shows a side sectional view of a structure 70 that includes a first intermediate sensor structure 72 and a second intermediate sensor structure 74 prior to singulation, and FIG. 3 shows a side sectional view of structure 70 following singulation. First intermediate sensor structure 72 is laterally displaced from second intermediate sensor structure 74 within structure 70. Additionally, each of first and second intermediate sensor structures 72, 74 includes the structural components described in connection with FIG. 1. That is, each of first and second intermediate sensor structures 72, 74 includes MEMS die 22, semiconductor die 24, lead frame 28, and bond wires 60, 66 all of which are covered in encapsulant 68. Further description of MEMS die 22, semiconductor die 24, lead frame 28, and bond wires 60, 66 of first and second intermediate sensor structures 72, 74 is not repeated herein for brevity.

In accordance with a particular embodiment, first and second intermediate sensor structures 72, 74 of structure 70 are interconnected via inactive/unused material regions 76 of each of a cap layer structure 78, a substrate structure 80, a semiconductor die structure 82, and a strip 84 of lead frames 28. Structure 70 further includes a channel 86 interposed between cavity 44 of first intermediate sensor structure 72 and cavity 44 of second intermediate sensor structure 74. Thus, cavity 44 of first intermediate sensor structure 72 and cavity 44 of second intermediate sensor structure 74 are in fluid communication with one another.

First intermediate sensor structure 72 is configured to be separated from second intermediate sensor structure 74 to produce a first MEMS sensor package, referred to herein as a first pressure sensor package 20A (FIG. 3), and to produce a second MEMS sensor package, referred to herein as a second pressure sensor package 20B (FIG. 3). That is, structure 70 may be sawn, diced, or otherwise singulated at inactive/unused material regions 76 bounded by dashed lines 88 in order to remove the material portion of structure 70 between dashed lines 88.

Following singulation, each of first and second pressure sensor packages 20A, 20B includes the structural components described in connection with FIG. 1. That is, each of first and second sensor packages 20A, 20B includes MEMS die 22, semiconductor die 24, lead frame 28, and bond wires 60, 66 all of which are covered in encapsulant 68. The letter "A" is used in FIG. 3 to denote the elements of first pressure sensor package 20A and the letter "B" is used herein to denote the elements of second pressure sensor package 20B for clarity of description. It should be observed that the singulation process separates channel 86 into two remaining portions. Thus, a first port 48A of first pressure sensor package 20A is a first portion of channel 86 and a second port 48B of second pressure sensor package 20B is a second portion of channel 86.

Figure 4:
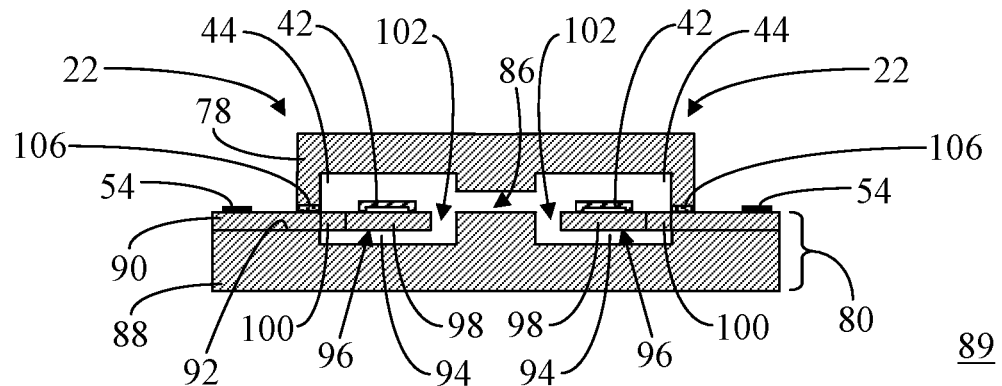
FIG. 4 shows a side sectional view of a portion of the structure of FIG. 2.
Figure 5:
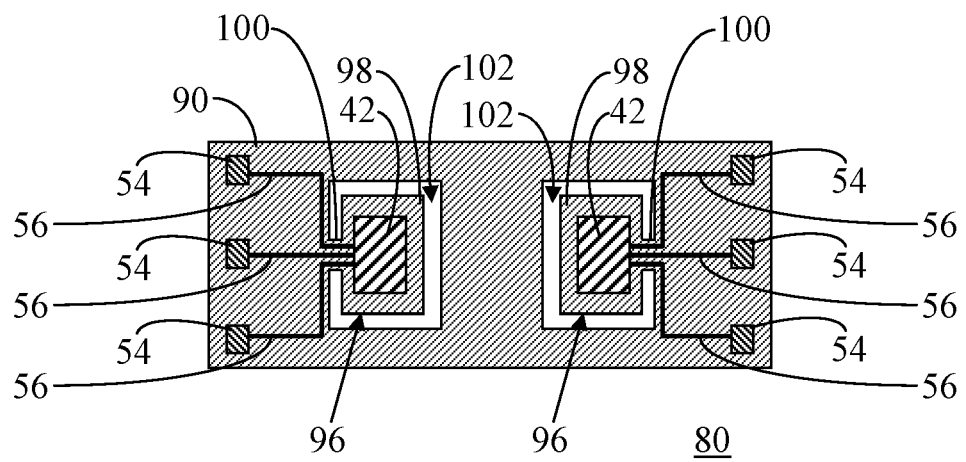
FIG. 5 shows a top view of a substrate structure that may be used to form the structure of FIG. 2.

Referring to FIGS. 4 and 5, FIG. 4 shows a side sectional view of a MEMS die structure 89 that is part of structure 70 (FIG. 2), and FIG. 5 shows a top view of substrate structure 80 that may be used to form structure 70. More particularly, MEMS die structure 89 of FIG. 4 includes cap layer structure 78 coupled with substrate structure 80 to form a pair of MEMS dies 22. However, it should be observed that FIG. 4 does not include semiconductor dies 24 (FIG. 2) and lead frames 28 (FIG. 2). FIG. 5 shows substrate structure 80 with cap layer structure 78 absent in order to reveal the features of substrate structure 80.

In general, substrate structure 80 includes a bulk substrate 88 and a structural layer 90 fixed to a surface 92 of bulk substrate 88. MEMS sensors 42 are formed on, or alternatively in, structural layer 90. As shown, sets of bond pads 54 and conductive traces 56 are also formed on structural layer 90. Substrate structure 80 is shown with only two MEMS sensors 42 for simplicity of illustration. It should be understood, however, that substrate structure 80 can include multiple MEMS sensors 42 arranged in pairs (as shown) in a high volume manufacturing configuration.

In accordance with an example embodiment, bulk substrate 88 has recesses 94 extending inwardly from surface 92 of bulk substrate 88, and structural layer 90 is fixed to surface 92 of bulk substrate 88 surrounding recesses 94. Material portions of structural layer 90 are removed surrounding each of MEMS sensors 42 to form cantilevered platform structures 96 at which each of MEMS sensors 42 reside. Thus, cantilevered platform structures 96 are formed in structural layer 90 and each extends over a respective one of recesses 94.

Each of cantilevered platform structures 96 includes a platform 98 and an arm 100 extending from platform 98. One end of arm 100 is fixed to platform 98 and the other end of arm 100 is fixed to bulk substrate 88 via an attachment of arm 100 to a portion of structural layer 90 fixed to surface 92 of bulk substrate 88 surrounding recess 94. Thus, once the material portions of structural layer 90 are removed, openings 102 extend through structural layer 90 and partially surround cantilevered platform structures 96. Accordingly, platforms 98 and arms 100 are suspended over recesses 94, with an end of each of arms 100 being the sole attachment point of each of cantilevered platform structure 96 to the surrounding bulk substrate 88. Although each of cantilevered platform structures 96 includes an arm 100 which forms a sole attachment point to the surrounding bulk substrate 88, other configurations may include more than one attachment point to the surrounding bulk substrate.

The illustrated configuration yields MEMS sensors 42 each of which is formed on a cantilevered platform structure 96 that is suspended over a recess 94. The cantilevered platform structure can achieve the benefits of improved package stress isolation and improved device performance, especially for pressure sensor configurations. However, it should be understood that alternative embodiments need not include that cantilevered platform structures overlying recesses. Instead, some embodiments may include MEMS sensors that are formed on a solid substrate (i.e., do not have recesses) and reside in cavities 44, but still require porting to an external environment via port 48 (FIG. 1) in side wall 50 (FIG. 1).

Figure 6:
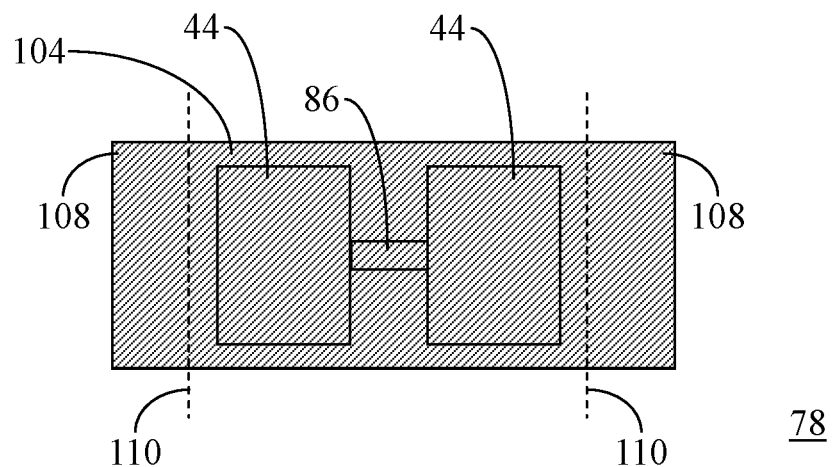
FIG. 6 shows a bottom view of a cap layer structure that may be used to form the structure of FIG. 2.

Referring now to FIGS. 4 and 6, FIG. 6 shows a bottom view of cap layer structure 78 that may be used to form structure 70 (FIG. 2). Cap layer 78 includes two cavities 44 and channel 86 extending inwardly from a surface 104 of cap layer structure 78. Cap layer structure 78 is shown with only two cavities 44 formed therein to correspond with substrate structure 80 (FIG. 5) and for simplicity of illustration. It should be understood, however, that cap layer structure 78 can include multiple cavities 44 arranged in pairs with channels 86 extending between pairs of cavities 44 in a high volume manufacturing configuration.

In general, cap layer structure 78 may be coupled with substrate structure 80 via a bond material 106, where bonding may be, for example, glass frit bonding, aluminum-germanium bonding, copper-to-copper bonding, or any other suitable bonding process and bonding material. Bond material 106 may be suitably located between cap layer structure 78 and substrate structure 80 outside of the boundaries of cavities 44 and channel 86. In some embodiments, when cap layer structure 78 is coupled with substrate structure, material portions 108 overlie bond pads 54. Thus, a saw-to-reveal process may be performed to expose bond pads 54 from cap layer structure 78. That is, following coupling with substrate structure 80, cap layer structure 78 may be sawn along saw lines (represented by dashed lines 110) shown in FIG. 6 to remove material portions 108 and thereby expose bond pads 54. As such, bond material 106 may be limited to those regions between saw lines 110 so as not to come in contact with bond pads 54. In other embodiments, bond material 106 may not be limited to the regions between saw lines 110. As such, following a saw-to-reveal process, bond material 106 may be removed from bond pads 54.

Figure 7:
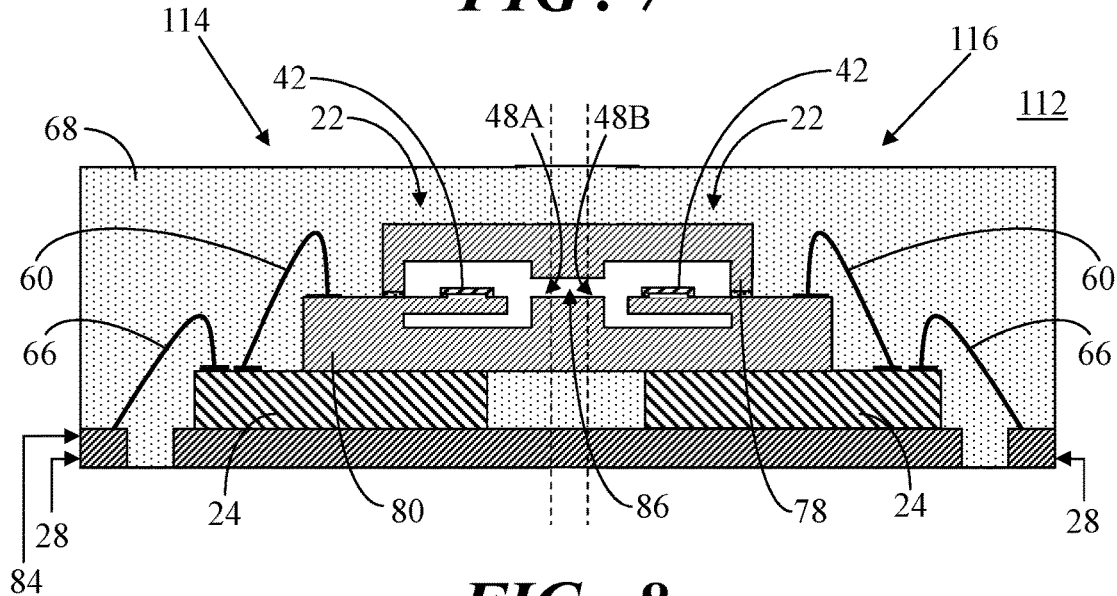
FIG. 7 shows a side sectional view of a structure that includes a first intermediate sensor structure and a second intermediate sensor structure prior to singulation in accordance with another embodiment.

FIG. 7 shows a side sectional view of a structure 112 that includes a first intermediate sensor structure 114 and a second intermediate sensor structure 116 prior to singulation in accordance with another embodiment. Structure 112 is similar to structure 70 (FIG. 2) described above. Thus, structure 112 includes cap layer structure 78, substrate structure 80, and strip 84 so that each of first and second intermediate sensor structures 114, 116 includes MEMS die 22, lead frame 28, and bond wires 60, 66 all of which are covered in encapsulant 68. However, in lieu of semiconductor die structure 82 (FIG. 2), structure 112 is fabricated utilizing previously singulated semiconductor dies 24 that are suitably coupled to strip 84. The resulting encapsulated structure 112 is singulated and channel 86 is split to expose the two ports 48A, 48B to the external environment, as discussed above.

Figure 8:
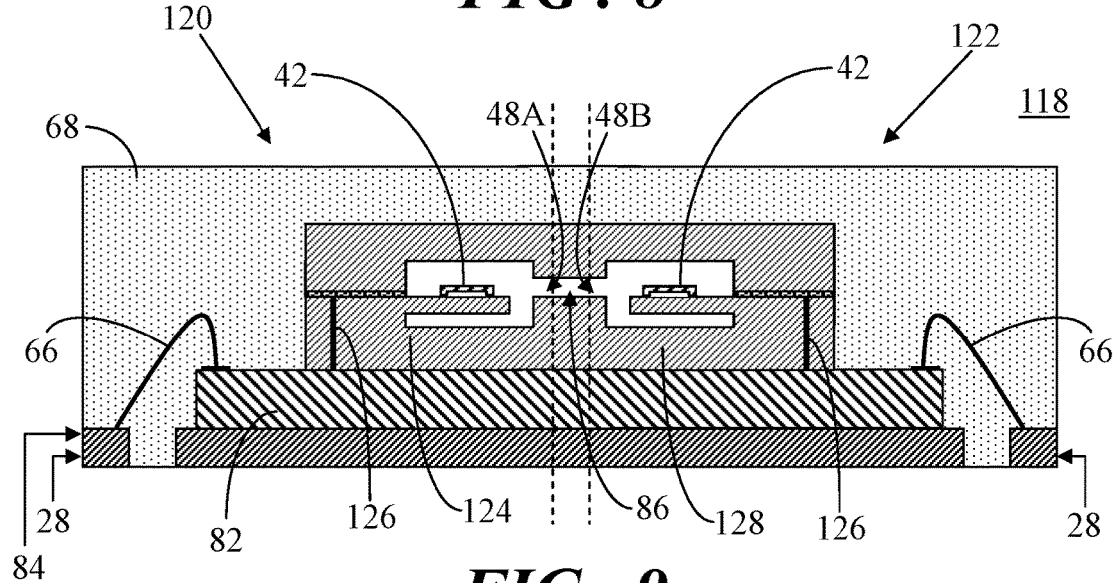
FIG. 8 shows a side sectional view of a structure that includes a first intermediate sensor structure and a second intermediate sensor structure prior to singulation in accordance with another embodiment.

FIG. 8 shows a side sectional view of a structure 118 that includes a first intermediate sensor structure 120 and a second intermediate sensor structure 122 prior to singulation in accordance with another embodiment. Structure 118 is similar to structure 70 (FIG. 2). Thus, structure 118 includes cap layer structure 78, semiconductor die structure 82, strip 84, and bond wires 66 all of which are covered in encapsulant 68. However, in lieu of substrate structure 80 (FIG. 2), structure 118 is fabricated utilizing a substrate structure 124 that includes many of the elements described above including MEMS sensors 42. However, substrate structure 124 includes electrically conductive interconnects in the form of electrically conductive vias 126 extending through a bulk substrate 128 of substrate structure in lieu of bond wires 60 (FIG. 2). Conductive vias 126 can thus form the electrical connections between MEMS sensors 42 and semiconductor dies 24 of semiconductor die structure 82.

Such a structural configuration eliminates the need for bond wires between the MEMS sensor and the underlying semiconductor die which may reduce packaging size and complexity. The resulting encapsulated structure 118 is singulated and channel 86 is split to expose the two ports 48A, 48B to the external environment, as discussed above.

Figure 9:
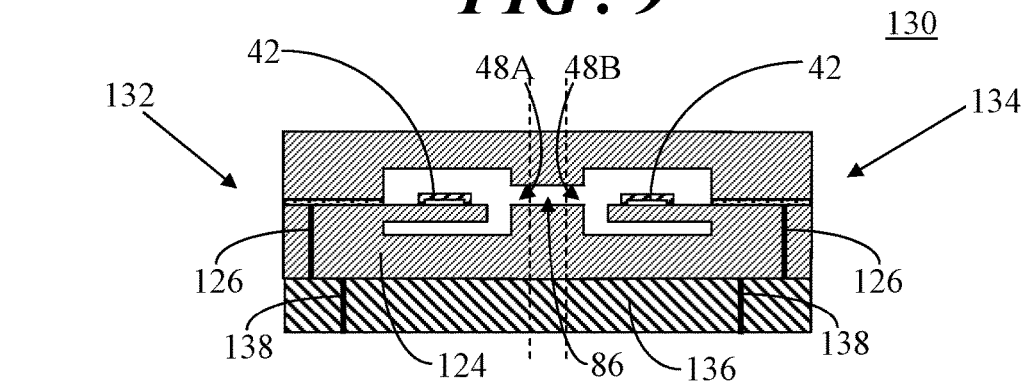
FIG. 9 shows a side sectional view of a structure that includes a first intermediate sensor structure and a second intermediate sensor structure prior to singulation in accordance with yet another embodiment.

FIG. 9 shows a side sectional view of a structure 130 that includes a first intermediate sensor structure 132 and a second intermediate sensor 134 structure prior to singulation in accordance with yet another embodiment. Structure 130 includes cap layer structure 78 and substrate structure 124 having electrically conductive vias 126 extending through it. Structure 130 further includes a semiconductor die structure 136 having electrically conductive vias 138 extending through it. Electrically conductive vias 138 are provided in lieu of bond wires 66 (FIG. 2) and lead frame 28 (FIG. 2) and enable input to and output from the resulting MEMS sensor packages.

Since conductive vias 126 are internal to substrate structure 124 and conductive vias 138 are internal to semiconductor die structure 136, the resulting package need not be encapsulated in encapsulant 68 (FIG. 1). Furthermore, savings may be achieved in terms of the packaging complexity and overall size of the resulting MEMS sensor packages. The resulting structure 130 is singulated and channel 86 is split to expose the two ports 48A, 48B to the external environment, as discussed above.

Figure 10:
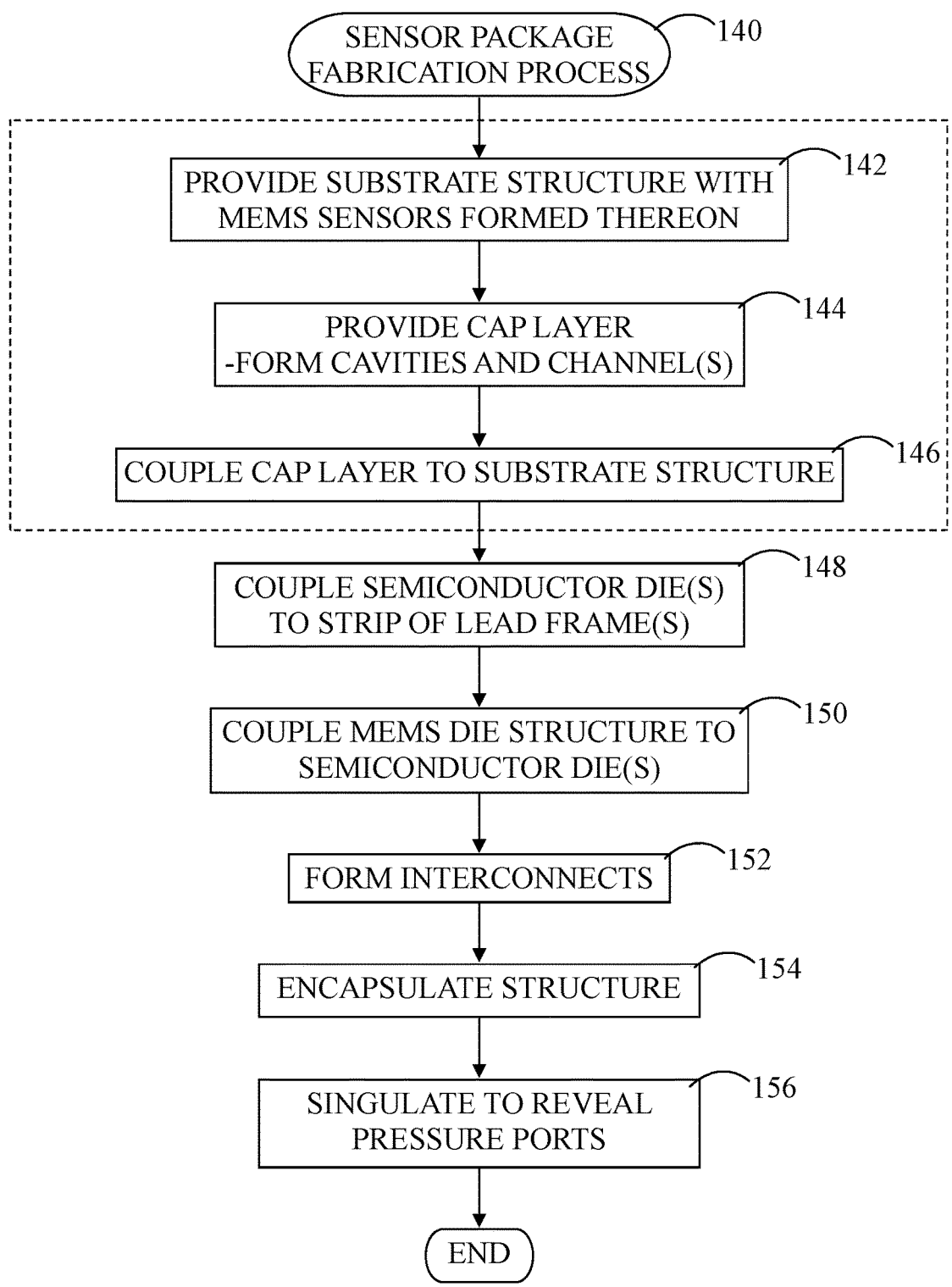
FIG. 10 shows a flowchart of a sensor package fabrication process in accordance with another embodiment.

Now referring to FIG. 10, FIG. 10 shows a flowchart of a sensor package fabrication process 140 in accordance with another embodiment. The methodology entails fabrication of side oriented ports (for example, pressure ports) into the silicon that are exposed at strip singulation. Sensor package fabrication process 140 will be described in connection with the fabrication of two MEMS sensor packages 20A, 20B (FIG. 3) shown in detail in FIGS. 1-6 for simplicity of illustration. However it should be apparent to those skilled in the art that the ensuing methodology may be executed to concurrently fabricate more than two MEMS sensor packages 20 in a high volume manufacturing environment. Additionally, it should be understood that sensor package fabrication process 140 may be adapted to produce any of the MEMS sensor package configurations alternatively described in connection with FIGS. 7-9 above.

The ordering of process operations presented below in connection with sensor package fabrication process 140 should not be construed as limiting, but is instead provided as an example of a possible fabrication method that may be implemented. Furthermore, it will be understood by those skilled in the art that the following process operations may be executed in a different order than presented below.

Sensor package fabrication process 140 includes process blocks related to the fabrication of MEMS die structure 89 (FIG. 4) having MEMS sensors 42 formed therein. These process blocks are delineated by a larger dashed line box and include blocks 142, 144, and 146. At block 142 of sensor package fabrication process 140, substrate structure 80 is provided having MEMS sensors 42 formed thereon. At block 144, cap layer structure 78 (FIGS. 4 and 6) is provided, with cavities 44 and channel 86 being formed in cap layer 78. At block 146, cap layer 78 is coupled to substrate structure 80 via bond material 106 to form MEMS die structure 89. As mentioned previously, bonding may be performed using any other suitable bonding process and material.

At a block 148, semiconductor die structure 82 containing semiconductor dies 24 may be coupled to strip 84 (FIG. 2) of lead frames 28 in some embodiments. Of course, in configurations that do not include a lead frame (e.g., structure 130 of FIG. 9), block 148 need not be performed. At a block 150, MEMS die structure 89 formed in accordance with process blocks 142, 144, 146 is coupled with semiconductor die structure 82 using, for example, a die attach adhesive.

At a block 152, the electrically conductive interconnects may be formed. Referring to FIG. 2, bond wires 60 may be formed between substrate structure 80 and semiconductor die structure 82. Additionally, bond wires 66 may be formed between semiconductor die structure 82 and external connection leads 64 of lead frames 28. Referring to FIG. 8, in configurations that do not include bond wires 60 (e.g., structure 118), the electrically conductive interconnects in the form of conductive vias 126 will be formed during fabrication of substrate structure 124 and the electrically conductive interconnects in the form of bond wires 66 will be formed after semiconductor die structure 82 is coupled to strip 84 of lead frames 28. Referring now to FIG. 9, in still other configurations that do not include any bond wires 60, 66 (e.g., structure 130), the electrically conductive interconnects in the form of conductive vias 126 will be formed during fabrication of substrate structure 124 and the electrically conductive interconnects in the form of vias 138 will be formed during fabrication of semiconductor die structure 136.

At a block 154, strip 84, semiconductor die structure 82, substrate structure 80, cap layer 78, and bond wires 60, 66 are encapsulated (i.e., covered) in encapsulant 68. Referring to FIGS. 2, 7, and 8, the side oriented channel 86 that will become ports 48A, 48B following singulation is protected from encapsulant 68. In configurations that do not include encapsulant 68 (e.g., structure 130 of FIG. 9), block 154 need not be performed.

Some prior art structures call for the bond wires to pass through a gel coating. The gel coating is prone to bubble formation and can cause flexing of the bond wires. Bubble formation and flexing of the bond wires can cause the parasitic capacitances between neighboring wires to change, thus adversely affecting the sensor offset. In accordance with the embodiments described herein, since bond wires 60 and bond wires 66 are encapsulated (FIGS. 2 and 6) in encapsulant 68 and/or through the use of conductive vias 126 (FIG. 7), the bond wires advantageously need not pass through the gel coating.

Following encapsulation block 154, a process block 156 is performed. At block 156, a singulation process (e.g., wet sawing, laser cutting, or the like) may be performed to separate the over molded structure into the individual first and second sensor packages 20A, 20B and to expose ports 48A, 48B. In cases in which the structure may be damaged by debris entering cavities 44 via ports 48A, 48B by conventional singulation techniques, singulation may be performed using a stealth dicing technique, by using a two step dicing operation to clear out any electrically conductive material produced by a first dicing operation prior to performing the second dicing operation, or any other technique which largely prevents or limits the entry of debris into cavities 44 via ports 48A, 48B.

Following block 156, sensor package fabrication process 140 ends following the production of multiple MEMS sensor packages, each of which includes a side port extending between a cavity and a side wall of the sensor package. The side port is configured to admit a fluid, e.g., air, external to the cavity into the cavity. When the MEMS sensor package includes a pressure sensor, the pressure of the fluid entering the cavity can be suitably detected by the pressure sensor.

An embodiment of a MEMS sensor package comprises a MEMS die, said MEMS die comprising a substrate having a first inner surface and a first outer surface, a MEMS sensor formed on the first inner surface, and a cap layer having a second inner surface and a second outer surface. The second inner surface of the cap layer is coupled to the first inner surface of the substrate. The cap layer includes a cavity extending inwardly from the second inner surface and overlying a region of the first inner surface of the substrate. The MEMS sensor resides in the cavity at the region of the first inner surface of the substrate, and one of the substrate and the cap layer includes a port extending between the cavity and a side wall of the MEMS die, where the side wall extends between the first outer surface of the substrate and the second outer surface of the cap layer.

An embodiment of a method of making MEMS sensor packages comprises providing a substrate having a first inner surface and a second outer surface, the substrate including a first MEMS sensor at a first region of the first inner surface and a second MEMS sensor at a second region of the first inner surface, the second region being laterally displaced from the first region, and providing a cap layer having a second inner surface and a second outer surface, the cap layer including a first cavity and a second cavity laterally displaced from the first cavity, each of the first and second cavities extending inwardly from the second inner surface. A channel is formed extending inwardly from one of the first inner surface of the substrate and the second inner surface of the cap layer. The second inner surface of the cap layer is coupled to the first inner surface of the substrate such that the first cavity overlies the first region to form a first intermediate sensor structure, the second cavity overlies the second region to form a second intermediate sensor structure, and the channel is interposed between the first and second cavities such that the first and second cavities are in fluid communication with one another. The first intermediate sensor structure is separated from the second intermediate sensor structure to produce a first MEMS sensor package and a second MEMS sensor package.

An embodiment of a structure comprises a substrate having a first inner surface and a first outer surface, a MEMS pressure sensor formed on the first inner surface, a cap layer having a second inner surface and a second outer surface, and an encapsulant covering the substrate and the cap layer, wherein the second inner surface of the cap layer is coupled to the first inner surface of the substrate, the cap layer includes a cavity extending inwardly from the second inner surface and overlying a region of the first inner surface of the substrate, the MEMS pressure sensor resides in the cavity and includes a pressure deformable diaphragm disposed at the region of the first inner surface of the substrate, one of the substrate and the cap layer includes a port extending between the cavity and a side wall of the cap layer, the side wall extending between the first outer surface of the substrate and the second outer surface of the cap layer, and the encapsulant does not obstruct the port.

Thus, a MEMS sensor package is formed, through the execution of relatively simple methodology, to include a MEMS sensor on substrate that is covered by a cap layer. The MEMS sensor resides in a cavity formed in the cap layer, and a port extends between the cavity and a side wall of one of the substrate and the cap layer. The port, formed in the side wall, is exposed during a strip singulation operation of the methodology so that fluid, such as air, external to the cavity can be admitted into the cavity. Accordingly, the MEMS sensor may be a pressure sensor which is stress isolated and can be overmolded, and the pressure sensor is capable of sensing pressure from an environment external to the sensor via the port.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. A vast number of variations or modifications are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method of making microelectromechanical systems (MEMS) sensor packages comprising:
   providing a substrate having a first inner surface and a second outer surface, said substrate including a first MEMS sensor at a first region of said first inner surface and a second MEMS sensor at a second region of said first inner surface, said second region being laterally displaced from said first region;
   providing a cap layer having a second inner surface and a second outer surface, said cap layer including a first cavity and a second cavity laterally displaced from said first cavity, each of said first and second cavities extending inwardly from said second inner surface;
   forming a channel extending inwardly from one of said first inner surface of said substrate and second inner surface of said cap layer;
   coupling said second inner surface of said cap layer to said first inner surface of said substrate such that said first cavity overlies said first region to form a first intermediate sensor structure, said second cavity overlies said second region to form a second intermediate sensor structure, and said channel is interposed between said first and second cavities; and
   separating said first intermediate sensor structure from said second intermediate sensor structure to produce a first MEMS sensor package and a second MEMS sensor package.

2. The method of claim 1 wherein said separating comprises splitting said channel into a first portion and a second portion, wherein:
   said first portion forms a first port extending between said first cavity and a first side wall of said first MEMS sensor package; and
   said second portion forms a second port extending between said second cavity and a second side wall of said second MEMS sensor package, each of said first and second side walls extending between said first outer surface of said substrate and said second outer surface of said cap layer.

3. The method of claim 2 wherein:
   said first port is configured to admit a fluid external to said first cavity into said first cavity; and
   said second port is configured to admit said fluid external to said second cavity into said second cavity.

4. The method of claim 2 further comprising encapsulating said substrate and said cap layer in an encapsulant, said encapsulating being performed prior to said separating such that following said separating, said encapsulant does not obstruct said first and second ports.

5. The method of claim 1 further comprising:
   coupling a first semiconductor die to said one of said first outer surface of said substrate and said second outer surface of said cap layer of said first intermediate sensor structure prior to said separating; and
   coupling a second semiconductor die to said one of said first outer surface of said substrate and said second outer surface of said cap layer of said second intermediate sensor structure prior to said separating, wherein following said separating said first MEMS sensor package further includes said first semiconductor die and said second MEMS sensor package further includes said second semiconductor die.

6. The method of claim 5 wherein said method further comprises:
   providing a wafer structure that includes both of said first and second semiconductor dies;
   aligning said first semiconductor die of said wafer structure with said first intermediate sensor structure; and
   aligning said second semiconductor die of said wafer structure with said second intermediate sensor structure, wherein said separating separates said wafer structure such that said first semiconductor die remains with said first MEMS sensor package and said second semiconductor die remains with said second MEMS sensor package.

7. The method of claim 5 further comprising:
   electrically coupling said first MEMS sensor with said first semiconductor die via first electrically conductive interconnects; and
   electrically coupling said second MEMS sensor with said second semiconductor die via second electrically conductive interconnects.

8. The method of claim 7 further comprising encapsulating said substrate, said cap layer, said first and second semiconductor dies, and said first and second electrically conductive interconnects in an encapsulant prior to said separating such that following said separating said encapsulant does not obstruct said first and second ports.

9. The method of claim 1 wherein:
said first MEMS sensor package comprises a first pressure sensor, said first pressure sensor including a first pressure deformable diaphragm disposed at said first region of said first inner surface of said substrate; and
said second MEMS sensor package comprises a second pressure sensor, said second pressure sensor including a second pressure deformable diaphragm disposed at said second region of said first inner surface of said substrate.

10. The method of claim 4 wherein said encapsulating comprises overmolding said substrate and said cap layer with said encapsulant, said encapsulant being a mold compound or a resin system.

11. The method of claim 4 wherein said separating comprises separating said encapsulant such that a first portion of said encapsulant remains overlying said first intermediate structure and a second portion of said encapsulant remains overlying said second intermediate structure.

12. The method of claim 11 wherein said separating said first intermediate sensor structure from said second intermediate sensor structure and said separating said encapsulant into said first and second portions are performed concurrently.

13. A method of making microelectromechanical systems (MEMS) sensor packages comprising:
providing a substrate having a first inner surface and a second outer surface, said substrate including a first MEMS sensor at a first region of said first inner surface and a second MEMS sensor at a second region of said first inner surface, said second region being laterally displaced from said first region;
providing a cap layer having a second inner surface and a second outer surface, said cap layer including a first cavity and a second cavity laterally displaced from said first cavity, each of said first and second cavities extending inwardly from said second inner surface;
forming a channel extending inwardly from one of said first inner surface of said substrate and said second inner surface of said cap layer;
coupling said second inner surface of said cap layer to said first inner surface of said substrate such that said first cavity overlies said first region to form a first intermediate sensor structure, said second cavity overlies said second region to form a second intermediate sensor structure, and said channel is interposed between said first and second cavities;
coupling a first semiconductor die to said one of said first outer surface of said substrate and said second outer surface of said cap layer of said first intermediate sensor structure;
coupling a second semiconductor die to said one of said first outer surface of said substrate and said second outer surface of said cap layer of said second intermediate sensor structure; and
following coupling of said first and second semiconductor dies to said first and second intermediate sensor structures, separating said first intermediate sensor structure from said second intermediate sensor structure to produce a first MEMS sensor package and a second MEMS sensor package, wherein said separating comprises splitting said channel into a first portion and a second portion, said first portion forming a first port extending between said first cavity and a first side wall of said first MEMS sensor package, and said second portion forming a second port extending between said second cavity and a second side wall of said second MEMS sensor package, each of said first and second side walls extending between said first outer surface of said substrate and said second outer surface of said cap layer, and following said separating said first MEMS sensor package further includes said first semiconductor die and said second MEMS sensor package further includes said second semiconductor die.

14. The method of claim 13 further comprising encapsulating said substrate, said cap layer, and said first and second semiconductor dies in an encapsulant, said encapsulating being performed prior to said separating such that following said separating said encapsulant does not obstruct said first and second ports.

15. The method of claim 14 further comprising:
prior to said encapsulating, electrically coupling said first MEMS sensor with said first semiconductor die via first electrically conductive interconnects; and
prior to said encapsulating, electrically coupling said second MEMS sensor with said second semiconductor die via second electrically conductive interconnects such that said encapsulating includes encapsulating said first and second electrically conductive interconnects.

16. The method of claim 14 wherein said encapsulating comprises overmolding said substrate, said cap layer, and said first and second semiconductor dies with said encapsulant, said encapsulant being a mold compound or a resin system.

17. The method of claim 14 wherein said separating comprises separating said encapsulant such that a first portion of said encapsulant remains overlying said first intermediate structure and said first semiconductor die, and a second portion of said encapsulant remains overlying said second intermediate structure and said second semiconductor die.

18. The method of claim 17 wherein said separating said first intermediate sensor structure from said second intermediate sensor structure and said separating said encapsulant into said first and second portions are performed concurrently.

19. The method of claim 13 wherein:
said first MEMS sensor package comprises a first pressure sensor, said first pressure sensor including a first pressure deformable diaphragm disposed at said first region of said first inner surface of said substrate, said first port being configured to admit a fluid external to said first cavity into said first cavity, said first pressure sensor being configured to sense a pressure of said fluid; and
said second MEMS sensor package comprises a second pressure sensor, said second pressure sensor including a second pressure deformable diaphragm disposed at said second region of said first inner surface of said substrate, said second port being configured to admit said fluid external to said second cavity into said second cavity, said second pressure sensor being configured to sense said pressure of said fluid.

20. A method of making microelectromechanical systems (MEMS) sensor packages comprising:
providing a substrate having a first inner surface and a second outer surface, said substrate including a first MEMS sensor at a first region of said first inner surface and a second MEMS sensor at a second region of said first inner surface, said second region being laterally displaced from said first region;

providing a cap layer having a second inner surface and a second outer surface, said cap layer including a first cavity and a second cavity laterally displaced from said first cavity, each of said first and second cavities extending inwardly from said second inner surface;

forming a channel extending inwardly from one of said first inner surface of said substrate and said second inner surface of said cap layer;

coupling said second inner surface of said cap layer to said first inner surface of said substrate such that said first cavity overlies said first region to form a first intermediate sensor structure, said second cavity overlies said second region to form a second intermediate sensor structure, and said channel is interposed between said first and second cavities;

encapsulating said substrate and said cap layer in an encapsulant by overmolding using a mold compound or a resin system; and following said encapsulating, separating said first intermediate sensor structure from said second intermediate sensor structure to produce a first MEMS sensor package and a second MEMS sensor package, wherein said separating comprises:

separating said encapsulant such that a first portion of said encapsulant remains overlying said first intermediate structure and a second portion of said encapsulant remains overlying said second intermediate structure; and splitting said channel into a first portion and a second portion, said first portion forming a first port extending between said first cavity and a first side wall of said first MEMS sensor package, and said second portion forming a second port extending between said second cavity and a second side wall of said second MEMS sensor package, each of said first and second side walls extending between said first outer surface of said substrate and said second outer surface of said cap layer, wherein following said separating, said encapsulant does not obstruct said first and second ports, said first port is configured to admit a fluid external to said first cavity into said first cavity, and said second port is configured to admit said fluid external to said second cavity into said second cavity.

* * * * *